United States Patent
Czeremuszkin et al.

(10) Patent No.: US 7,298,072 B2
(45) Date of Patent: Nov. 20, 2007

(54) TRANSPARENT SUPPORT FOR ORGANIC LIGHT EMITTING DEVICE

(75) Inventors: Grzegorz Czeremuszkin, Pierrefonds (CA); Mohamed Latreche, Dollard-des-Ormeaux (CA); Michael Robert Wertheimer, Westmount (CA)

(73) Assignee: Nova-Plasma Inc., Dollard-des-Ormeaux, Quebec (CA)

(*) Notice: Subject to any disclaimer, the term of this patent is extended or adjusted under 35 U.S.C. 154(b) by 158 days.

(21) Appl. No.: 10/482,896

(22) PCT Filed: May 14, 2002

(86) PCT No.: PCT/CA02/00707

§ 371 (c)(1),
(2), (4) Date: Jan. 5, 2004

(87) PCT Pub. No.: WO03/005461

PCT Pub. Date: Jan. 16, 2003

(65) Prior Publication Data

US 2004/0174115 A1    Sep. 9, 2004

(30) Foreign Application Priority Data

Jul. 6, 2001   (CA) ................... 2352567

(51) Int. Cl.
*H05B 33/04* (2006.01)
(52) U.S. Cl. ............... 313/292; 313/512; 313/635
(58) Field of Classification Search ........ 313/498–512, 313/634, 635, 283–292; 315/169.3; 345/36, 345/45, 76
See application file for complete search history.

(56) References Cited

U.S. PATENT DOCUMENTS

| | | | |
|---|---|---|---|
| 4,640,583 A * | 2/1987 | Hoshikawa et al. | 349/153 |
| 5,023,668 A * | 6/1991 | Kluy et al. | 399/308 |
| 5,098,495 A * | 3/1992 | Smits et al. | 156/150 |
| 5,122,410 A | 6/1992 | Lofgren et al. | |
| 5,260,095 A | 11/1993 | Affinito | |
| 5,547,508 A | 8/1996 | Affinito | |
| 5,580,630 A * | 12/1996 | Byrd | 428/47 |
| 5,844,363 A * | 12/1998 | Gu et al. | 313/506 |

(Continued)

FOREIGN PATENT DOCUMENTS

EP    0 385 054    3/1998

(Continued)

OTHER PUBLICATIONS

A.S. De Silva Sobrinho. M et al. Transparent barrier coatings on polyethylene terephthalate by single and dual-frequency plasma-enhanced chemical vapor deposition. 3190-3198 J. Vac. Sci. Technol. A 16(6), Nov./Dec. 1998.

*Primary Examiner*—Nimeshkumar D. Patel
*Assistant Examiner*—Christopher M. Raade
(74) *Attorney, Agent, or Firm*—Bachman & LaPointe, P.C.

(57) ABSTRACT

An improved transparent support substrate in an organic light emitting diode (OLED) device comprises an organic polymer support film and a composite layer on the support film which is disposed intermediate the support film and the diodes of the OLED; the composite layer has first and second discrete coating layers bonded together in opposed facing relationship; the layers are of material impermeable to oxygen and water vapor but contain inadvertent discontinuities which result in discontinuity-controlled permeation of oxygen and water vapor.

35 Claims, 5 Drawing Sheets

U.S. PATENT DOCUMENTS

| | | | |
|---|---|---|---|
| 6,111,274 A * | 8/2000 | Arai | 257/96 |
| 6,228,434 B1 | 5/2001 | Affinito | |
| 6,369,871 B1 * | 4/2002 | Hanada et al. | 349/158 |
| 6,503,634 B1 * | 1/2003 | Utz et al. | 428/448 |
| 6,749,940 B1 | 6/2004 | Terasaki et al. | |
| 2001/0044035 A1 | 11/2001 | Morii | |

FOREIGN PATENT DOCUMENTS

| | | |
|---|---|---|
| EP | 1170323 A2 | 9/2002 |
| JP | 2000-318081 | 11/2000 |
| WO | WO 00/36665 | 6/2000 |
| WO | WO 00/26973 | 11/2000 |
| WO | WO 00/65670 | 11/2000 |

* cited by examiner

TRANSPARENT SUPPORT FOR ORGANIC LIGHT EMITTING DEVICE

TECHNICAL FIELD

This invention relates to organic light emitting diode (OLED) devices and methods for their production; the invention is more especially concerned with oxygen and water vapor impermeable flexible substrates for such devices and methods of producing such flexible substrates.

BACKGROUND ART

An organic light emitting diode (OLED) device is an emissive display in which a transparent substrate is coated with a transparent conducting material, for example, indium-tin oxide (ITO) which forms a hole-injecting electrode as the lowest layer of a light emitting diode. The remaining layers of the diode commencing with the layer adjacent the ITO layer comprise a hole transporting layer (HTL), an electron transporting layer (ETL) and an electron-injecting electrode.

The hole-transporting layer is essentially a p-type semi-conductor and the electron-transporting layer is essentially an n-type semi-conductor. These are organic layers and in particular are conjugated organics or conjugated polymers, the latter are poor conductors without dopants but are doped to conduct holes (p-type) or electrons (n-type).

The electron-injecting electrode is typically a metal such as calcium, lithium or magnesium.

When a voltage is applied to the diode, electrons flow towards the hole-transporting layer and holes flow towards the electron-transporting layer. This produces electron-hole recombinations which release energy as light. Collectively the hole-transporting layer (HTL) and the electron transporting layer (ELT) form the electroluminescent layer (EL) of the diode.

Such OLEDs provide a new generation of active organic displays of high efficiency, large view angle, excellent color definition and contrast, and most important of low cost. In those displays, high-quality images are created by a matrix of the light emitting diodes encapsulated in transparent materials.

The diodes are patterned to form a pixel matrix, where a single-pixel junction or EL emits light of a given color . All organic displays, designed so far, contain oxygen and moisture-sensitive components, namely organic semiconductors and electron-injecting metals.

Consequently, the diodes require protection by means of an impermeable layer forming a barrier to oxygen and water vapor, which impermeable layer envelops the layers of the diode, and a substrate supporting the enveloped diode, of high transparency, and which is impermeable providing a barrier to oxygen and water vapor.

Thus far glass plate has been the supporting substrate of choice, since it has excellent barrier and transparency properties. On the other hand, glass plate has the drawbacks of brittleness, high-weight, and rigidity.

A strong demand exists for plastic-film substrate material that may bring flexibility, high impact resistance, low weight, and, most of all, which may enable roll-to-roll processing, as opposed to batch processing which has been used thus far. Such plastic film substrate material should, of course, be essentially impermeable, displaying low oxygen and water vapor transmission rates.

Although one may expect some further improvement in oxygen and moisture resistance of organic semiconductors employed in the diodes, extremely water-sensitive electron-injecting metals such as Ca, Li and Mg seem to be irreplaceable until a major breakthrough is made in solid state physics or in display design, both rather unlikely in the predictable future.

Other properties, which the substrate material for organic displays should present, such as thermal resistance, low roughness, and low costs, are listed in [J. K. Mahon et al., Society of Vacuum Coaters, Proceedings of the $42^{nd}$ Annual Technical Conference, Boston 1999, p. 496]. Organic photovoltaic devices also require similar, flexible, barrier materials, so do liquid crystal flexible displays, where barrier requirements are, however, less demanding.

Organic displays are proposed for such equipment as high-resolution computer displays, television screens, cell-phones and advanced telecommunication devices etc., which require µm-scale precision manufacturing, vacuum operations and lithography. In other words: technologies similar to those at present used in microelectronics. Other applications include large scale displays for advertising and entertainment, and various communication devices. These latter applications may require lower precision in manufacturing, processing in inert-dry atmospheres, roll-to-roll operations, inexpensive methods of patterning, for example, stamping or ink jet printing. In other words: low-cost technologies, perhaps similar to those at present used in special quality graphic-printing.

The problem is thus to develop flexible polymer films as supporting substrates which are essentially barriers to oxygen and water vapor and which can be produced at low thickness sufficient for their support functions and such that they can be readily employed in commercial manufacture of the organic devices in roll-to-roll processing.

In order to satisfy market requirements relative to existing competitive organic displays having glass plate substrates or the more conventional inorganic light emitting devices, a polymer film substrate for an OLED would need to prevent oxygen and water molecules from reaching the diode components for a period of years and typically for a life of at least 10,000 hours.

It is known in the flexible packaging art, to coat polymer films or sheets with thin inorganic coatings, for example, metal oxide coatings, to render the polymer films or sheets essentially impermeable to oxygen and water vapor. In practice it is impossible in commercial manufacture to produce such coatings without some pinholes or other defects which permit passage of oxygen and water molecules through the otherwise impermeable coating. This may not be a serious problem in the flexible packaging art where the packaging is typically protecting a food product of limited shelf life. However, the levels of permeability that may be acceptable in the short working life of flexible packaging in the food and other industries will certainly not meet the more exacting requirements for organic displays based on organic light emitting diodes which must have a life of years rather than the days or weeks which represent the typical useful or working life of flexible packaging.

DISCLOSURE OF THE INVENTION

This this invention seeks to provide an organic light emitting diode device having a flexible film substrate of enhanced impermeability to oxygen and water vapor.

This invention also seeks to provide such a device in which the flexible film substrate comprises an organic polymer film having an impermeable barrier coating thereon and in which loss of impermeability arising from pinholes and other types of defects in the coating is reduced.

Still further, this invention seeks to provide a flexible film barrier support substrate for an OLED device.

This invention also seeks to provide a method of producing a flexible film barrier support substrate for an OLED device.

Still further, this invention seeks to provide a method of producing an OLED device having a flexible film barrier support substrate.

Still further, this invention seeks to provide an OLED device in which the diodes are encased in an impermeable barrier casing comprising a flexible film substrate for the diodes and an impermable covering, at least one of the substrate and the covering being of enhanced impermeability to oxygen and water vapor.

In accordance with one aspect of the invention there is provided in an organic light emitting diode device, in which light emitting organic diodes are encased in a barrier envelope comprising a transparent substrate supporting said diodes and a barrier covering, said substrate and covering being impermeable to oxygen and water vapor, the improvement wherein at least one of said substrate and said covering comprises: i) an organic polymer support film, and ii) a composite layer on said support film and disposed intermediate said support film and said light emitting diodes, said composite layer comprising first and second discrete coating layers bonded together in opposed facing relationship, each of said first and second coating layers being impermeable to oxygen and water vapor when formed as a continuous coating, each of said first and second coating layers having inadvertent discontinuities therein such that said coating layers exhibit discontinuity-controlled permeation of oxygen and water vapor therethrough.

In accordance with another aspect of the invention there is provided in a method of manufacturing an organic light emitting device in which light emitting diodes are formed on a transparent substrate impermeable to oxygen and water vapor, the improvement wherein the transparent substrate is as defined hereinbefore.

In accordance with still another aspect of the invention there is provided a transparent support substrate for an organic light emitting diode device comprising: i) an organic polymer support film, and ii) a composite layer on said support film, said composite layer being adapted to be disposed between said support film and light emitting organic diodes of an organic light emitting device, said composite layer comprising first and second discrete coating layers bonded together in opposed facing relationship, each of said first and second coating layers being impermeable to oxygen and water vapor when formed as a continuous coating, each of said first and second coating layers having inadvertent discontinuities therein such that said coating layers exhibit discontinuity-controlled permeation of oxygen and water vapor therethrough.

In accordance with yet another aspect of the invention there is provided a method of producing a transparent support substrate for an organic light emitting device comprising: a) coating a first transparent organic polymer film surface with a first coating layer, b) coating a second transparent organic polymer film surface with a second coating layer, c) bonding said coating layers together in opposed facing relationship to form a composite layer between said first and second polymer film surfaces, each of said first and second coating layers being impermeable to oxygen and water vapor when formed as a continuous coating; each of said first and second coating layers having inadvertent discontinuities therein such that said coating layers exhibit discontinuity-controlled permeation of oxygen and water vapor therethrough.

DESCRIPTION OF PREFERRED EMBODIMENTS i) OLED

Organic light emitting diode devices rely on electroluminesce, their general structure is well established and is not the subject of this invention. Such devices employ component layers which are sensitive to oxygen and water molecules and must thus be effectively sealed from ingress of oxygen and water vapor while maintaining transparency to light and different desired physical characteristics.

In general an OLED comprises a plurality of light emitting diodes mounted on a support substrate. The support substrate must have high transparency to light, and present a barrier to oxygen and water vapor. The diodes placed on the support substrate are covered by a barrier covering, also impermeable to oxygen and water vapor. The support substrate and covering together form a barrier envelope encasing the diodes.

ii) Substrate

The supporting substrate of the invention comprises an organic polymer support film having a composite layer thereon. The composite layer comprises a pair of coatings bonded together in opposed facing relationship.

The substrate may comprise a polymer film with the composite layer thereon or it may comprise a pair of polymer films in opposed facing relationship with the composite layer sandwiched therebetween such as to form an intermediate layer between the polymer films.

The substrate may suitably have a thickness of 5 µm to 10 mm, more typically 25 µm to 1000 µm.

a) Polymer Films

The support film should be transparent and of any suitable organic polymer, including homopolymers, copolymers and terpolymers which can be fabricated as a suitably thin film having the necessary and desirable physical characteristics to form a barrier support substrate for the diodes, physical characteristics of particular importance are strength and flexibility at desired film thickness for the OLED device.

While the polymer films do not need to be and generally will not be impermeable to oxygen and water vapor, polymer films which are of lesser permeability to oxygen and water vapor will generally be preferred to those of higher permeability.

Suitable polymers for the polymer film include, by way of example, polyolefins, for example, polyethylene and polypropylene; cyclopolyolefins, for example, polynorbornenes; polycarbonates; polyesters; polyarylates, polyacrylates, polyethyleneterephthalate; polyethylenenaphthalate; polystyrene; polyamides; polyimides; polyethersulfone, and polyorganosilicones, as well as other transparent polymers and copolymers including other high $T_g$ polymers. The polymer film may include one or more layered polymer components.

Preferred polymer films are chosen from high $T_g$ polymers, for example cyclopolyolefins, polyethersulfones, polyarylates, and from polyethyleneterephthalate and polyethylenenaphthalate.

The polymer films will have a thickness to achieve the desired substrate thickness.

Where the support substrate comprises a pair of polymer films with the coating layers therebetween, the polymer films may be of the same or different polymers.

b) Impermeable Composite

The composite layer provides a barrier to oxygen and water vapor and is composed of a pair of discrete coating layers which when formed as continuous coatings are impermeable to oxygen and water vapor.

On the other hand, since discontinuities are inevitable in the discrete coating layers, each coating layer will exhibit discontinuity-controlled permeation of oxygen and water molecules therethrough.

As it will be described below, each discrete coating layer may be formed as a single coating or may be composed of a plurality of single coatings preferably of different materials, which also show the presence of inadvertent discontinuities. The plurality of single coatings are each formed as discrete coatings of the coating layer.

These inadvertent discontinuities described more fully below are essentially pinholes which form during deposition of the coating layer and are inherent in the coating techniques available, and other types of defects which arise from external factors during or subsequent to deposition of the coating layers.

The coating layers may be the same or different; by way of example, suitable coating layers may be formed from transparent materials such as oxides, nitrides, mixed compositions, and salts; for example, $SiO_x$, $SiO_xC_y$, $Si_xN_y$, $Si_xN_yC_z$, $SiO_xN_y$, $TiO_x$, $Al_xO_y$, $SnO_y$, indium-tin oxide, magnesium fluoride, magnesium oxyfluoride, calcium fluoride, tantalum oxide, yttrium oxide, zirconium oxide, barium oxide, magnesium oxide, and mixtures thereof, wherein x is from 1 to 3, y is 0.01 to 5 and z is 0.01 to 5. Particular examples include silica, alumina and titania; other examples include amorphous carbon, borosilicate, sodium and potassium glass.

Preferred coating layers are stoichiometric or non-stoichiometric silicon dioxide deposited by plasma, stoichiometric or non-stoichiometric silicon nitride deposited by plasma; and multilayer structures including discrete coatings of one or both of silicon dioxide and silicon nitride, and polymer coatings, for example polyacrylates or organic plasma polymers obtained from organosilicones, hydrocarbons or acrylates.

Each coating layer suitably has a thickness of 10 nm to 10 µm, preferably 60 nm to 5 µm and more preferably 100 nm to 2 µm.

In a particular embodiment, one or both coating layers may be composed of a plurality of single coatings, for example alternate inorganic- and organic coatings; in such case, the coatings of the plurality are formed as discrete coatings in separate coating operations, and there are at least two such discrete coatings in a coating layer, such as those described in the literature [ ]. This is most desirable especially in the case of coating layers thicker than 150–200 nm, where single coatings of different materials provide necessary mechanical stability and barrier properties.

The barrier substrate must be transparent to light and suitably will have a transparency greater than 65% and preferably greater than 85%, measured according to ASTM D 1746-97.

Each coating layer which forms a barrier to oxygen and water vapor should suitably display an oxygen transmission rater lower then 1 $cm^3/(m^2 day \cdot atm)$, and preferably lower than 0.01 $cm^3/(m^2 day \cdot atm)$ and more preferably lower than 0.005 $cm^3/(m^2 day \cdot atm)$ measured according to ASTM F 1927 or D 3958; and a water vapor transmission rate (WVTR) lower than 0.01 $g/(m^2 day \cdot atm)$, preferably lower than 0.005 $g/(m^2 day \cdot atm)$ and more preferably lower than 0.001 $g/(m^2 day \cdot atm)$ as measured according to ASTM F 1249.

c) Adhesives

The pair of coating layers are suitably bonded or laminated together with an adhesive.

In one embodiment of the method of producing coating layers, each layer is independently formed as a discrete (single or multiple layer) coating on a film substrate to form a pair of coated film substrates which are then bonded together, coating layer to coating layer. In this way the coating layers form a composite layer sandwiched between a pair of film substrates.

In a first embodiment this assembly forms the support substrate.

In a second embodiment one of the film substrates is composed of first and second polymer films having release properties at the interface therebetween for ready removal of the first polymer film from the substrate after the bonding of the two film substrates in coating layer to coating layer contact. In this way the coating layers form a composite layer on the second polymer film as the support substrate, and the first polymer film functions as a thin temporary protective film on the side of the support substrate on which the diodes are to be placed.

The release coating may be formed from the same classes of adhesive employed for bonding the coating layers together, but with appropriate adjustment, as well known in the adhesive art, to introduce the required release characteristics.

Adhesives that may be employed for bonding the coating layers and for the release coating include thermoplastic-and elasto-plastic polymers; polymers which are curable by radiation, for example, ultraviolet or electron-beam; heat, by chemical initiators or by combinations thereof; organic or organic-containing adhesives, such organics being, for example, acrylics, urethanes, epoxides, polyolefins, organosilicones and others; composite ceramic materials, composite organic/ceramic materials; and products of plasma-polymerization, oligomerization, or curing of organic-, organosilicon and other organometallic compounds, either volatile or deposited by other means such as spraying, casting or dip-coating.

Particular examples of adhesives include elastomer based adhesives, for example; synthetic organic adhesives, for example, phenolic resins, acrylic resins, polyvinyl acetals, epoxies, polyamides or silicone adhesives; and inorganic polymer adhesives, for example, soluble silicates such as may be prepared by fusion of silica and alkali metal carbonates.

The adhesive forms an adhesive layer bonding the two coating layers. The adhesive layer may suitably have a thickness of 50 nm to 10 µm, preferably 100 nm to 2 µm. Especially advantageously the adhesive layer has a thickness less than the dimensions of the discontinuities.

In preferred embodiments the adhesive exhibits a scavenging effect towards oxygen, water or both and such scavenging may be, for example, by adsorption, absorption or chemical reaction. In this way the adhesive layer provides an additional barrier.

iii) Method of Producing Support Substrate

The method of producing the support substrate essentially involves coating each of a pair of organic polymer films, as described hereinbefore, with a coating layer, as described hereinbefore.

It will be understood that the pair of films may be derived from a single sheet or roll of film, with the coated film being cut to provide two separate coated films. However, in a continuous or continual manufacture, the coating layers will preferably be formed independently on separate films.

The coating layers may be applied by various coating techniques, but preferably by physical vapor deposition (PVD), for example, evaporation or sputtering or by chemical vapor deposition (CVD), for example, plasma enhanced chemical vapor deposition (PECVD) or organic vapor phase deposition (OVPD). These methods are capable of producing very thin coatings, which are stable and flexible but of satisfactory hardness, and which exhibit low oxygen and water vapor permeations. PVD and PECVD are carried out under vacuum. In this way a pair of film substrates is obtained each having a coating layer.

The substrates are then bonded to, or adhered, together coating layer to coating layer, thereby forming a supporting substrate which comprises the pair of film substrates in opposed facing relationship with the coating layers forming a composite layer sandwiched between the film substrates.

In another embodiment the second of the pair of film substrates is itself a composite substrate comprising a pair of film layers bonded together with an adhesive whereby the film layers can be readily separated. After bonding the coating layers together the outermost of the film layers of the second film substrate provides a temporary protective layer which is removed when the diodes are to be mounted on the support substrate. In this case the diodes are supported in contact with the remaining film layer of the second film substrate.

v) Applications of Support Substrate

In one embodiment the support substrate forms the front, transparent support of an OLED device, the diodes of the device being encapsulated on the other side by a suitable non-transparent barrier covering, also impermeable to oxygen and water vapor, thus providing the OLED device having one-side light emission. A suitable nontransparent barrier covering material may be of a metal can, plate, foil or an evaporated film, as is well known in the OLED art.

In another embodiment the support substrate forms the front, transparent background of an OLED device, and the barrier covering on the other side is also formed of a transparent support substrate of the invention, thus providing an OLED device that is transparent and emits light on both sides. A support substrate according to the invention thus encapsulates the diodes both as the front support and as the rear barrier covering, together forming a barrier envelope.

In still another embodiment, the support substrate of the invention forms the barrier covering and the front support of the OLED device is of another material, for example glass, as known in the OLED art.

The support substrate according to the invention may be used also in other types of devices, such as liquid crystal displays or in organic photovoltaic devices, which are known in prior art to require transparent materials impermeable to oxygen and water vapor.

vi) Manufacture of OLED

The OLED is suitably formed under vacuum conditions to minimize introduction of contaminants which may chemically or physically damage the OLED or alter its characteristics. Small molecule diode components, sensitive to oxygen and water molecules, are deposited onto the support substrate by vacuum evaporation. One particular type of organic light emitting diode, namely polymeric light emitting diodes (PLED) may, for example, be deposited onto the support substrate for example from a solution in a suitable organic solvent in an inert atmosphere. The support substrate is produced as outlined hereinbefore. Thereafter, in a vacuum process a transparent conductive layer, for example, indium-tin oxide, is deposited on the support substrate.

The transparent conductive layer is patterned to form the lower electrode of the diode, which is the hole-injecting layer. On the hole-injecting layer there is deposited, successively, the hole-transporting layer and the electron-transporting layer, both of which are organic layers, and thereafter the electron-injecting layer which forms the upper electrode, and which may be, for example, of calcium, lithium, magnesium or aluminium, or suitable metal alloys.

The afore-mentioned layers may be deposited by vacuum evaporation, well known in the OLED art.

Instead of vacuum evaporation, the organic layers and the upper electrode may also be deposited by printing, for example ink jet printing, stamping or other transfer techniques in an inert atmosphere, as well known in the PLED art.

DESCRIPTION OF PREFERRED EMBODIMENTS WITH REFERENCE TO DRAWINGS

Figure 1:
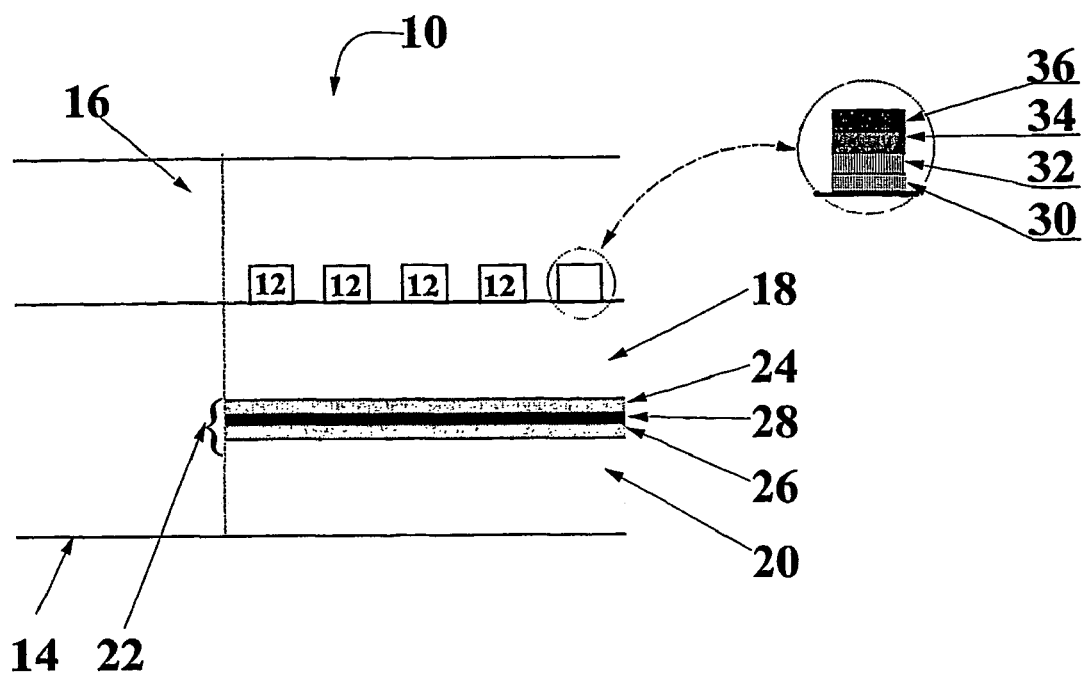
FIG. 1 illustrates schematically a portion of an OLED of the invention in a first embodiment.

With further reference to FIG. 1, there is illustrated a portion of an OLED 10 having a plurality of diodes 12 on a support substrate 14 and an impermeable envelope 16.

Support substrate 14 comprises polymer films 18 and 20 with a composite layer 22 therebetween.

Composite layer 22 comprises a coating layer 24 formed on polymer film 18 and a coating layer 26 formed on polymer film 20. Coating layers 24 and 26 are bonded together by an adhesive layer 28.

FIG. 1 includes an exploded view of a diode 12. Each diode 12 is of the same form. Diode 12 comprises, in a stack, a hole-injecting layer 30, a hole-transporting layer 32, an electron-transporting layer 34 and an electron-injecting layer 36.

In the manufacture, coating layer 24 is first formed as a discrete layer on polymer film 18 and separately coating layer 26 is formed as a discrete layer on polymer film 20.

Figure 2:
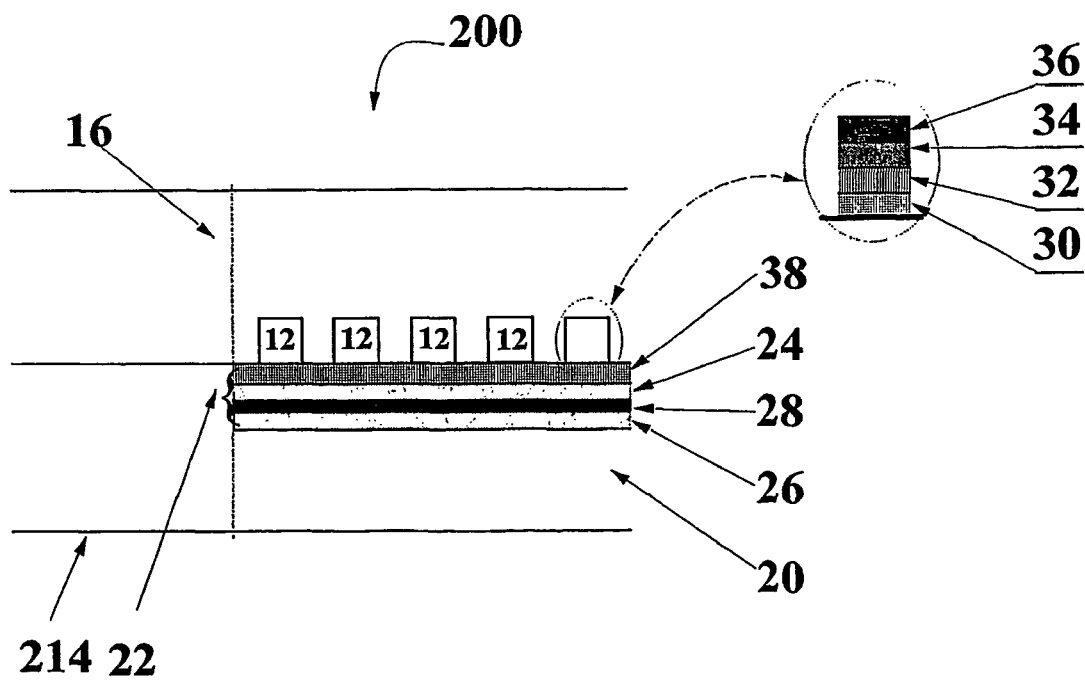
FIG. 2 illustrates schematically a portion of an OLED of the invention in a second embodiment.

With reference to FIG. 2, there is shown an OLED 200 which differs from OLED 10 in the structure of support substrate 214.

The manufacture of support substrate 214 is essentially the same as that for support substrate 14 except that polymer film 18 comprises a pair of support films 38 and 42 (film 42 is not shown) which are bonded together in opposed facing relationship by a release coating (not shown). Prior to assembly of OLED 200, support film 42 is removed to expose support film 38 for contact with the diodes 12.

Figure 3:
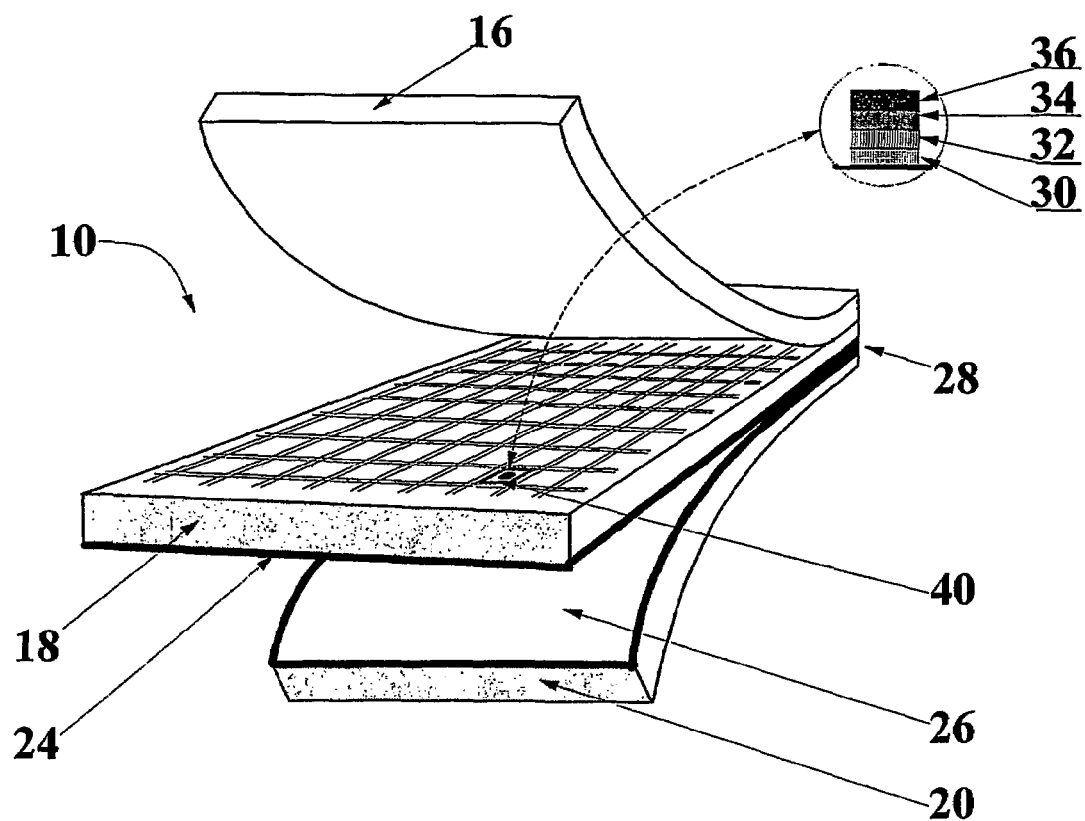
FIG. 3 illustrates schematically the OLED of FIG. 1 partly exploded.

With further reference to FIG. 3, there is shown an OLED of FIG. 1, partly exploded so that the arrangement of diodes in the OLED 10 can be observed.

Figure 4:
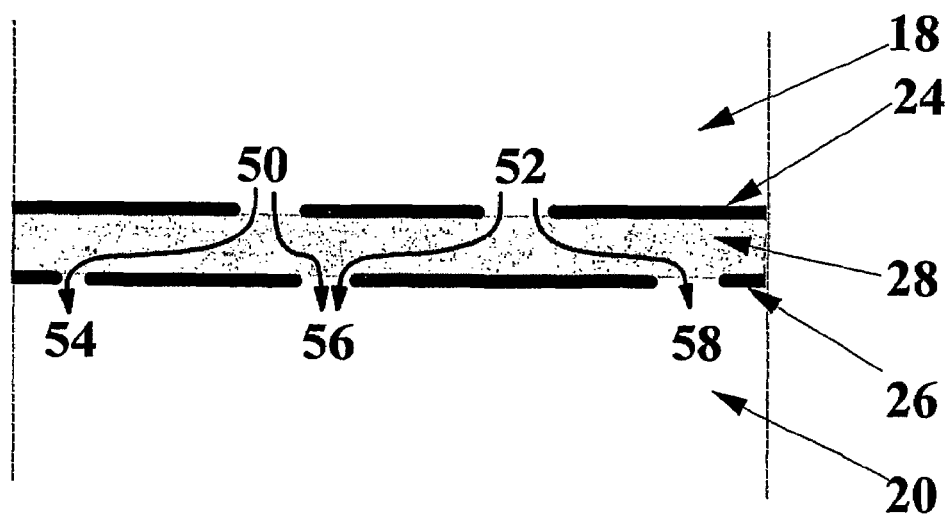
FIG. 4 illustrates schematically the low permeation in a support substrate of the invention.
Figure 6:
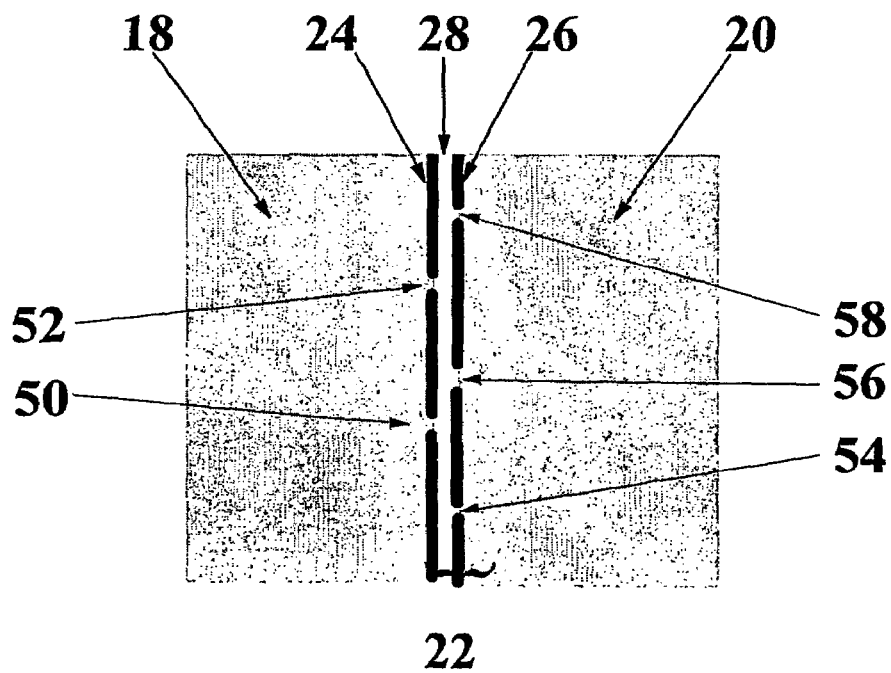
FIG. 6 illustrates schematically a support substrate of the invention.

With further reference to FIGS. 4 and 6, there is further illustrated composite layer 22 of the OLED 10 of FIGS. 1 and 3.

Coating layer 24 has inadvertent defects 50 and 52 and coating layer 26 has inadvertent defects 54, 56 and 58, which defects are of essentially the same size as the thickness of adhesive layer 28. Since such inadvertent defects are random and thus not necessarily aligned in the opposed coating layers 24 and 26, a tortuous path for passage of oxygen and water vapor is provided as illustrated by the arrows. In this way a diminished defect controlled permeation is exhibited.

In FIG. 6 the composite layer 22 is shown in conjunction with the polymer films 18 and 20 in the support substrate 14.

Figure 8:
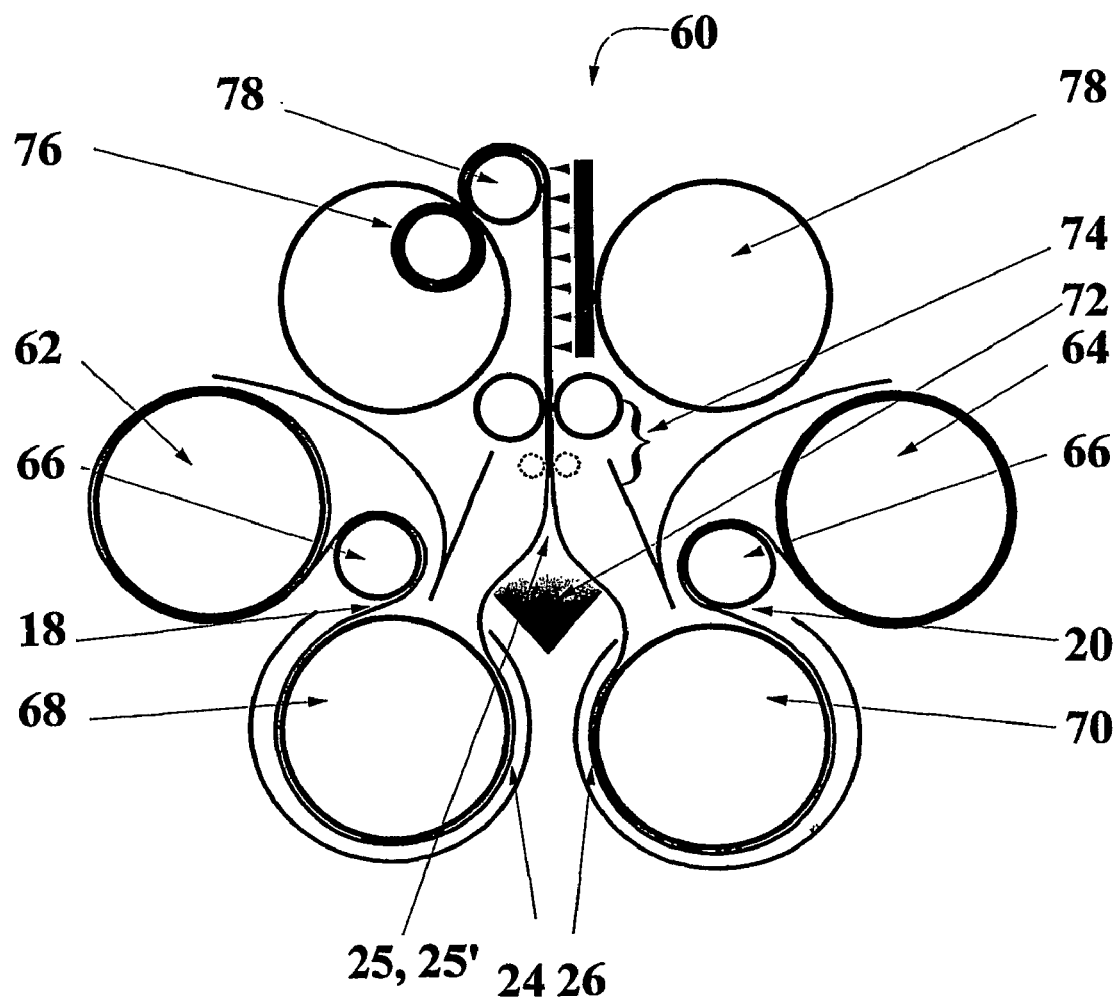
FIG. 8 is a schematic representation of a system for producing the support substrate of the invention.

With further reference to FIG. 8, there is illustrated schematically a system for manufacture of the support substrate 14 of FIG. 6. The system comprises an assembly 60 having a roll 62 of polymer film 18 and a roll 64 of polymer film 20.

Assembly 60 further includes degassing roll 66, a coating drum 68 for polymer film 18 and a coating drum 70 for polymer film 20 and an adhesive deposition zone 72.

Assembly 60 further includes laminator 74, a rewind roll 76 and a support roll 78.

In operation polymer films 18 and 20 are continuously fed from rolls 62 and 64 respectively over degassing rolls 66 to coating drums 68 and 70 respectively.

An adhesive layer 25 is applied to coating layer 24 on one face of polymer film 18 in adhesive deposition zone 72 and adhesive layer 25' is applied to coating layer 26 on one face of polymer film 20 in adhesive deposition zone 72, in such a way that coating layers 24 and 26, applied to the faces of polymer films 18 and 20, are in facing relationship.

The thus coated polymer films 18 and 20 are fed through laminator 74 where lamination occurs with coating layers 24 and 26 in opposed facing relationship. Lamination involves application of an adhesive between the coating layers 24 and 26 and cure of the adhesive, the nature of which depends on the adhesive employed.

The resulting laminate which is support substrate 14 is fed onto rewind roll 76.

The support substrate 14 may be fed directly to a station for OLED manufacture or may be stored and subsequently transported to a station for OLED manufacture.

The manufacture is suitably carried out under vacuum which minimizes the risk of defects in coating layers 24 and 26 as a result of dust particles or other contaminants. After deposition, the coating layers 24 and 26, which are the working impermeable layers providing a barrier to oxygen and water vapor, are shielded or protected by the polymer films 18 and 20.

Experimental and Explanations

Discontinuities a) Nature of Defects.

The coating layers in the composite layer of the barrier support substrate each contain inadvertent discontinuities which permit permeation of oxygen and water vapor through the otherwise impermeable layers.

The decrease in permeation of oxygen and water vapor through a polymer film substrate resulting from inorganic, impermeable coatings is usually characterized by a Barrier Improvement Factor (BIF), namely the measured ratio of permeation of the bare substrate to that of the coated film. Such inorganic coatings may decrease permeation of oxygen and water vapor through polymer films by several orders of magnitude, thus showing a BIF of $10^3$, $10^4$ or more for thin polymer film substrates. However, the barrier properties of simple coated polymer films are still at least two orders of magnitude higher than those required for an OLED.

The permeation of gases through silica-coated plastic films is a discontinuity or defect-controlled phenomenon [A. S. da Silva Sobrinho, G. Czeremuszkin, M. Latrèche, G. Dennler and M. R. Wertheimer, Surf. and Coat. Technol. 116–119, 1204 (1999), H. Chatham, Surf. Coat. Technol. 78, 1 (1996)]. This means that the residual permeation is due to the presence of micrometer- and submicrometer-size defects in the coatings. Size and shape of defects, their number density, and thickness of the plastic substrate film, are found to be important parameters that determine permeation through coated films.

Three main types of inadvertent defects in the coatings may be distinguished, namely:
 submicrometer-size pinholes, characteristic to the method of deposition and related to surface micro-roughness of the polymer film,
 sub-micrometer to multimicrometer-size defects due to dust and micro-particles,
 crackers and scratches created during production, handling and converting.

All of those defects are practically inevitable in real industrial-scale (roll-to-roll) manufacture operations.

Evenly distributed, sub-micrometer-size pinholes contribute to overall permeation, and lead to a quasi one-dimensional diffusion front at the back face of the coated film. Permeation through those small pinholes decreases the lifetime of an organic display, causing its uniform deterioration. On the other hand, large defects, for example, related to dust particles, will form zones of localized diffusion, where the rapid local deterioration of the device will be observed as "dark spots" in the display. The presence of a single, dust-related defect in the barrier encapsulation may cause failure of the display much before its expected lifetime, thus justifying the rejection of the final product by quality control. Therefore, technology which provides barrier-coated films, practically free of large defects, will be of very high value to the organic display industry.

Decreasing the number density of defects in inorganic barrier-coated films produced by physical vapor deposition (PVD) and plasma enhanced chemical vapor deposition (PECVD) is a very difficult task, since some requirements are in mutual contradiction. For example, the required very low permeability (low defect density) calls for thick inorganic barrier coatings [A. S. da Silva Sobrinho, G. Czeremuszkin, M. Latrèche, and M. R. Wertheimer, J. Vac. Sci. Technol. A 18, 149 (2000).], but these thick barrier coatings are usually brittle, and show high internal stresses, low flexibility and low stretchability. Polymer films, even of optical grade, show certain surface micro-roughness, which, as described above, is an important source of submicron-size pinholes in the coatings deposited on such films.

b) Defect-Controlled Permeation

In order to characterize sub-micrometer size defects in transparent barrier coatings deposited on transparent polymer films, a special detection technique based on plasma etching has been developed. Defects are thereby rendered visible in optical microscopy (OM), their patterns may be observed by simple visual inspection, and their number densities and size distributions can be evaluated with relative ease. In addition a simple model of permeation through defects in otherwise impermeable coatings has been developed, which allows a better understanding and analysis of the mechanism of permeation through barrier-coated polymer films [G. Czeremuszkin, M. Latrèche, A. S. da Silva Sobrinho, and M. R. Wertheimer, SVC, Proc 42$^{nd}$ Annual Tech. Conf., 176 (1999).]. Using this model, it has now been determined that only a very thin surface layer of the polymer film substrate, in the immediate vicinity of the barrier-coating, plays a significant role in the overall barrier performance. This has permitted an evaluation of the maximum BIF for a pair of discrete coating layers bonded together on a polymer film, displaying defect-controlled permeation and devoid of large pinholes, cracks or scratches, which is merely twice that of the same polymer film with a single coating layer. The upper-limit of applicability of the model, corresponding to BIF=1, expected for very thick substrate films was identified. It was found that the lower-limit of the applicability of derived equations corresponds to a substrate polymer film with a thickness close to the size of typical defects in the coating. Below this lower-limit thickness value, the model cannot be used.

A special technique for detection of micrometer-size defects in transparent barrier coatings deposited on transparent polymer films has been developed. The technique is based on plasma etching, and renders defects and their patterns visible in optical microscopy (OM) and detectable by simple visual inspection. A simple model of permeation through defects in otherwise impermeable coatings, allows a better understanding of mechanisms of permeation through barrier-coated polymer films.

For purposes of this invention the model of permeation was modified by adopting the theory of heat transport in thin plates, for diffusion of permeant through thin films. As the conclusion from theoretical considerations, the invention deposits a barrier coating onto each of two independent polymer films and bringing them together, coated face to coated face in permanent contact, for example by laminating, using a layer of adhesive, preferably having low permeation to water vapor and oxygen. Four critical parameters that determine permeation through the proposed structure have been identified:

A. Size of defects in the component barrier-coatings;
B. Number density of defects in the coatings;
C. Thickness of the adhesive layer, which should preferably be lower than the size of defects.
D. The material of the adhesive layer, which should preferably show low permeability to the permeants.

As confirmed by experimental results, the overall permeation through transparent barrier-coated polymer films is lowered, according to the present invention, by at least an additional two orders of magnitude or more. For large defects in a single coating, for example, those due to dust particles, this translates to an extremely low or negligible probability of finding a "dark spot" in a large organic display having a barrier support substrate of the invention.

The invention thus relies on previously unforeseen observations and conclusions from a novel approach to very thin, double coated layers on polymer film support substrates in which the coating layers have micrometer and sub-micrometer-size defects. In order to calculate the permeation through coated, micrometer-thick polymer films, the theory of heat diffusion across thin plates was adapted (it is known that the heat transport and the transport of permeant through thin plates are described by the same types of diffusion equations).

On this basis the permeation P through a pair of coating layers of a composite layer of the invention can be defined by:

$$P = \frac{2\pi D \Phi \circ L}{\operatorname{acosh}\left(\dfrac{d^2}{2R_0^2} - 1\right)} \quad (I)$$

where each coating layer contains randomly distributed defects of the same circular shape and the same diameter $2R_o$.

Typically, $2R_o=0.5-2$ μm for micrometer-size pinholes, and $2R_o=10$ μm for dust-related defects, where the number density of those defects may reach several thousands per cm$^2$, and not more than a few per cm$^2$, respectively.

This situation is equivalent to permeation through the layer with a defect controlled permeation. The plastic film of small thickness, L, and of diffusion coefficient of the permeant, D, has the coatings on both sides, which contain the defects of radius $R_o$. Those defects, in both coatings, are separated by a horizontal (projected) distance d. The film is then exposed to the permeant only from one side, concentration of which at the surface zones on both sides is then $\Phi_o$ and 0, respectively.

This is equivalent to permeation through a transparent substrate of the invention comprising a pair of transparent polymer films having the composite layer therebetween, with a defect-controlled permeation. It is assumed that the polymer films are of thickness L, and of diffusion coefficient of the permeant D, and each coating layer has defects of radius $R_o$, and the defects in both coatings are separated by an overall horizontal distance d. The transparent substrate is then exposed to the permeant only from one side, concentration of which at the surface zone or both sides is then $\Phi_o$ and O, respectively.

FIG. 4 presents schematically the situation when the thickness of composite layer 22 is comparable with the average size of defects 50, 52, 54, 56 and 58 in the coating layers 24 and 26. As explained below, permeation of gases through such a structure may be very low, and BIF>>2 may be expected. This is due to the tortuous path of permeant molecules, which will encounter a much longer effective path of diffusion in the bulk of the composite layer, when transported from one defect 50 in the coating layer 24 to an adjacent defect 54 in the coating layer 26.

In particular, defects 50 and 52 in coating layer 24 and defects 54, 56 and 58 in coating layer 26 occur randomly so that on a statistical probability basis defects 50 and 52 are remote from, and in non-opposed relationship with defects 54, 56 and 58.

Figure 5:
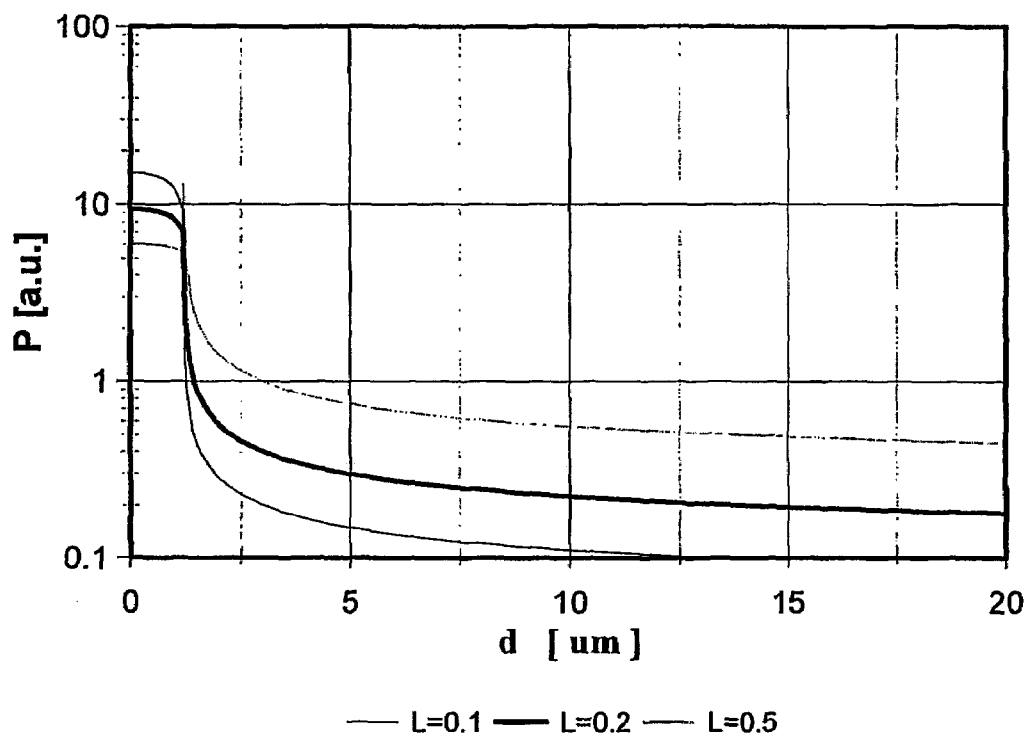
FIG. 5 demonstrates graphically the calculated permeation through the support substrate of FIG. 4 relative to horizontal distance between defect centres.

FIG. 5 shows the calculated permeation through a support substrate of the invention in which the coating layers contain a single (circular) defect of radius Ro each, vs. the horizontal (projected) distanced between centers of those defects.

In the case of $d<R_o$, the defects partly overlap, and the permeation may only be 2× lower than the permeation through a single coating. In the case of $d>>R_o$, permeation decreases rapidly, which, however, strongly depends on the thickness of the polymer film. It can be seen from FIG. 5 that permeation can be two orders of magnitude lower than permeation through a polymer film having a single coating layer. This may be achieved when the polymer film is very thin, and when the polymer material possesses low permeability of the permeant in question.

The principle of this invention may be further explained by reference to FIG. 6. FIG. 6 shows a support substrate 14 of the invention comprising polymer films 18 and 20 each having been previously coated with transparent coating layers 24 and 26 respectively, each containing random defects 50, 52 and 54, 56 and 58, respectively, and then brought together in permanent contact by means of adhesive lamination, with adhesive layer 28. Overall permeation through this support substrate 14 film will be much lower than permeation through each distinct coated film (film 18 with coating layer 24 or film 20 with coating layer 26). The support substrate 14, according to the invention, may exhibit super-barrier properties (OTR<0.001 cm$^3$/(m$^2$day·atm), and WVTR<0.000001 g/(m$^2$day·atm), even if both component films show much poorer barrier performance. More important, however, the substrate 14 according to the invention practically eliminates harmful effects of permeation-through large defects in the coating layers, such as those created by dust particles.

Figure 7:
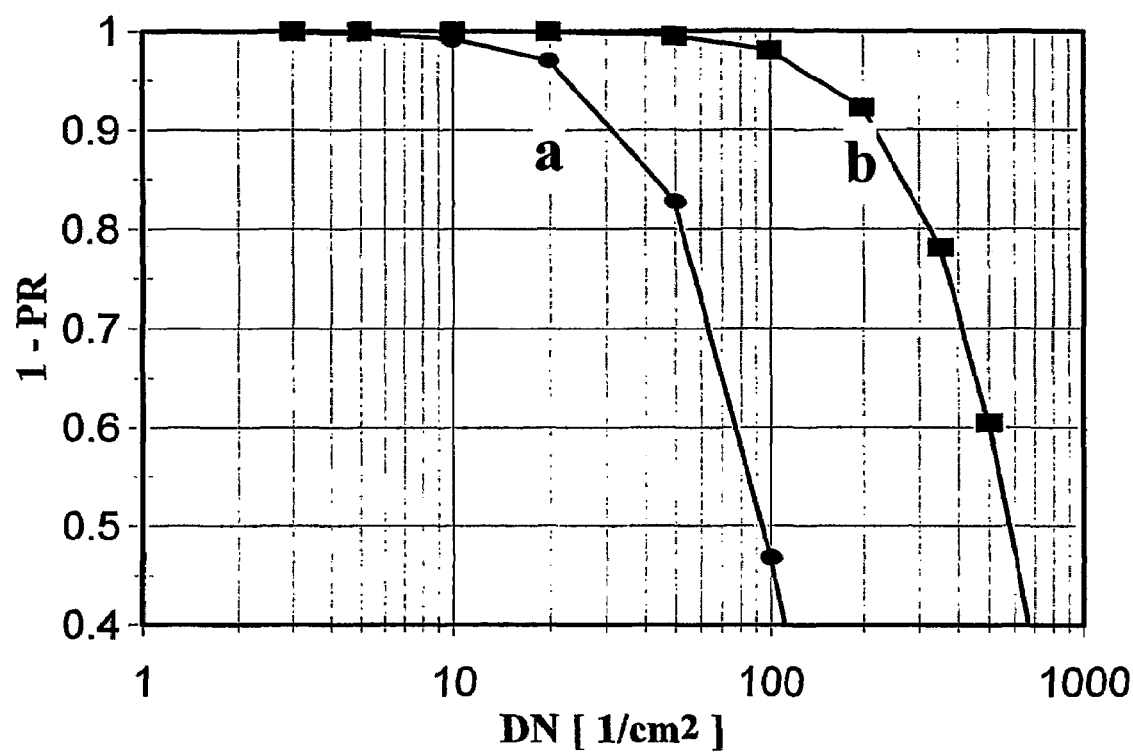
FIG. 7 is a plot demonstrating the probability (PR) of matching random defects face-to-face vs defect number density (DN) in the coating layers of a support substrate of the invention.

FIG. 7 presents in two cases (a and b) the probability of matching random defects face-to-face in two coating layers brought together in accordance with the invention. A simplified statistical analysis used here, based on so-called Bernoulli trials, leads to overestimation of the probability. In the analysis, the circular "defect" of a given radius (representing a pinhole in the second coating layer) is randomly placed on the surface representing the first coating layer, which contains a given number of identical, circular defects. The probability of defects overlapping is then calculated. The procedure is repeated, so that the total number of trials corresponds to the number of defects in the second coating layer. Obviously, in the Bernoulli Scheme, the defect may be randomly placed in the position already occupied by another defect (and previously taken in the trials), which gives rise to the source of the overestimation. Therefore the real probability of defects matching is even lower than the one calculated.

As can be seen from the presented analysis, and this is confirmed by experimental results, the overall permeation through transparent barrier-coated plastic films may be lowered, in accordance with this invention, by an additional two orders of magnitude with probability exceeding 99.9%. In the case of large defects, such as those due to dust particles, the number density of which is not high in the original coating layers, this translates into an extremely low or negligible probability of finding a "dark spot" in a large organic display produced using the support substrate according to the invention.

EXAMPLES

Polymer films of polyethyleneterephthalate and polypropylene were "cleaned" of large dust particles by blowing compressed nitrogen over their surfaces. A controlled number of sodium chloride micro-crystals were deposited onto the surface of the polymer films using an aerosol of salt solution in water, created ultrasonically. The deliberately contaminated films were then coated with 36 or 70 nm of silica using the PECVD method, from HMDSO/O$_2$/Ar precursor mixture. The films were then washed with flowing water (DI/RO, 18 MΩ), which dissolved the micro-crystals, and were then dried with dry nitrogen. Since the polymer films were not silica coated in places previously occupied by the crystals, the above procedure provided numerous well-characterized defects in the coating. The sodium chloride crystals deposited onto the polymer films, and corresponding defects in the coating, were clearly visualized, the latter using the defect detection technique described above. In order to control the number of defects and to avoid false, dust-related pinholes, the cleaning/washing operation was performed in a clean-room. Two such coated films were laminated face-to-face using a thin layer of an UV-curable adhesive, which shows lower oxygen permeation than adhesives typically used in bonding of polymer films. Lamination was performed both in a vacuum and in air. Up to two orders of magnitude improvement of the barrier (vs. single-side coated film with defects) was observed.

In another experiment, two typical silica-coated polymer films were laminated using a ~3 µm thickness of soft adhesive, of similar permeation to those typically used in bonding of plastic films. The measured OTR value was only ~2× lower than the one determined for the single component film.

The results obtained in this experiment part are summarized in Table I.

The experiments confirm the theoretical findings, and they show that:

the thickness of the adhesive, more precisely, the distance between the two coating layers containing defects, should be preferably smaller than the size of the defects in the coatings;

the material of an adhesive between the two coating layers should preferably display low permeability to the permeant.

In accordance with the invention it has been determined that there are four parameters that particularly determine permeation through the support substrate of the invention.

A. The size of defects in the component transparent barrier-coating layers, which are responsible for permeation through such component barriers;

B. The number density of defects in the component transparent barrier-coating layers, which determines permeation through such component barriers;

C. The distance between the coating layers of the two component transparent barrier-coatings containing defects (equivalent to the thickness of the laminating or adhesive layer), which, according to the invention, should preferably be less than the typical size of defects mentioned in A above.

D. The material(s) filling the gap between the two coating layers (equivalent to the material of an adhesive layer), which, according to this invention, should preferably show low permeability to the permeant.

Support substrates prepared according to the invention show substantial improvement in barrier properties. When the parameters shown in A–D above are properly chosen, this improvement may reach or exceed two orders of magnitude.

Advantages of the support substrates of the invention, are the following:

practically total elimination of permeation through large-scale, dust-related defects, thus preventing "dark spot" appearance in organic displays;

significant improvement of barrier properties, thus allowing one to reach the super-barrier level with coatings, which themselves do not show sufficiently low permeation;

excellent flexibility of the film in handling and converting, due to the position of the coatings close to the neutral plane for bending;

protection of the coating layers against mechanical damage, as a result of their being sandwiched between polymer films.

The invention claimed is:

1. A transparent support substrate for an organic light emitting device comprising:
   i) an organic polymer support film, and
   ii) a composite layer on said support film, said composite layer being adapted to be disposed between said support film and light emitting organic diodes of an organic light emitting device, said composite layer comprising first and second discrete coating layers bonded together in opposed facing relationship, each of said first and second coating layers being impermeable to oxygen and water vapor when formed as a continuous coating, each of said first and second coating layers having inadvertent discontinuities therein such that said coating layers exhibit discontinuity-controlled permeation of oxygen and water vapor therethrough, said first and second coating layers being bonded together with an adhesive layer having a thickness of 50 nm to 10 μm such that said coating layers are spaced apart by a distance less than the dimensions of the inadvertent discontinuities in said coating layers, said inadvertent discontinuities being selected from:
   a) submicrometer-size pinholes characteristic of coating layer deposition and micro-roughness of said polymer support film;
   b) submicrometer to multimicrometer-size defects due to dust and microparticles; and
   c) cracks and scratches created in production, handling and converting of said substrate;
   said substrate having a transparency greater than 65%, by ASTM D1746-97, said composite layer having an oxygen transmission rate by ASTM F1927 and D3985 lower than 0.1 cm$^3$/(m$^2$day·atm), and a water vapor transmission rate lower than 0.01 g/(m$^2$day) by ASTM F1249.

2. A substrate according to 1 wherein each of said discrete coating layers is a single coating.

3. A substrate according to claim 1 where at least one of said first and second discrete coating layers is composed of a plurality of discrete single coatings of different materials.

4. A substrate according to claim 1, wherein said transparent substrate comprises first and second organic polymer support films in opposed facing relationship with said composite layer sandwiched therebetween.

5. A substrate according to claim 1, wherein said transparent substrate has a thickness of 5 μm to 10 mm and said first and second coating layers each have a thickness of 100 nm to 2 μm.

6. A substrate according to claim 5 wherein said adhesive layer has a thickness of 100 nm to 2 μm.

7. A substrate according to claim 1, wherein said adhesive layer displays low permeability to oxygen and water vapor.

8. A substrate according to claim 7, wherein said inadvertent discontinuities in said first and second coatings occur randomly such that on a statistical probability basis discontinuities in said first coating layer are remote from, and in non-opposed relationship, with discontinuities in said second coating layer.

9. A substrate according to claim 1 wherein said adhesive layer has a thickness of 50 nm to less than 1 μm.

10. A device according to claim 1, wherein said transparency is greater than 85%.

11. In an organic light emitting device in which light emitting diodes are encased in a barrier envelope comprising a transparent substrate supporting said diodes and a barrier covering, said substrate and covering being impermeable to oxygen and water vapor, the improvement wherein at least one of said substrate and said covering comprises:
   a transparent support substrate comprising:
   i) an organic polymer support film, and
   ii) a composite layer on said support film, said composite layer being adapted to be disposed between said support film and light emitting organic diodes of an organic light emitting device, said composite layer comprising first and second discrete coating layers bonded together in opposed facing relationship, each of said first and second coating layers being impermeable to oxygen and water vapor when formed as a continuous coating, each of said first and second coating layers having inadvertent discontinuities therein such that said coating layers exhibit discontinuity-controlled permeation of oxygen and water vapor therethrough, said first and second coating layers being bonded together with an adhesive layer having a thickness of 50 nm to 10 μm such that said coating layers are spaced apart by a distance less than the dimensions of the inadvertent discontinuities in said coating layers, said inadvertent discontinuities being selected from:
   a) submicrometer-size pinholes characteristic of coating layer deposition and micro-roughness of said polymer support film;
   b) submicrometer to multimicrometer-size defects due to dust and microparticles; and
   c) cracks and scratches created in production, handling and converting of said substrate;
   said substrate having a transparency greater than 65%, by ASTM D1746-97, said composite layer having an oxygen transmission rate by ASTM F1927 and D3985 lower than 0.1 cm$^3$/(m$^2$day·atm), and a water vapor transmission rate lower than 0.01 g/(m$^2$day) by ASTM F1249.

12. A device according to claim 11 wherein both said substrate and said covering are formed from said film and said composite layer.

13. A device according to claim 11 wherein said substrate is formed of said film and said composite layer.

14. A device according to claim 11 wherein said covering is formed of said film and said composite layer.

15. A device according to claim 11 wherein each of said discrete coating layers is a single coating.

16. A device according to claim 15, wherein said transparent substrate comprises first and second organic polymer support films in opposed facing relationship with said composite layer sandwiched therebetween.

17. A device according to claim 15 wherein said composite layer has an oxygen transmission rate by ASTM F1927 and D3985 lower than 0.005 cm$^3$/(m$^2$day·atm).

18. A device according to claim 15, wherein said transparent substrate has a thickness of 5 μm to 10 mm, and said first and second coating layers each have a thickness of 100 nm to 2 μm.

19. A device according to claim 18 wherein said adhesive layer has a thickness of 100 nm to 2 µm.

20. A device according to claim 18, wherein said adhesive layer displays low permeability to oxygen and water vapor.

21. A device according to claim 20, wherein said inadvertent discontinuities in said first and second coatings occur randomly such that on a statistical probability basis discontinuities in said first coating layer are remote from, and in non-opposed relationship, with discontinuities in said second coating layer.

22. A device according to claim 11 where at least one of said first and second discrete coating layers is composed of a plurality of discrete single coatings of different materials.

23. A device according to claim 11, wherein said adhesive layer has a thickness of 50 nm to less than 1 µm.

24. In a method of manufacturing an organic light emitting device in which light emitting organic diodes are formed on a transparent substrate impermeable to oxygen and water vapor, the improvement wherein the transparent substrate comprises:
  i) an organic polymer support film, and
  ii) a composite layer on said support film and disposed intermediate said support film and said light emitting diodes,
    said composite layer comprising first and second discrete coating layers bonded together in opposed facing relationship, each of said first and second coating layers being impermeable to oxygen and water vapor when formed as a continuous coating, each of said first and second coating layers having inadvertent discontinuities therein such that said coating layers exhibit discontinuity-controlled permeation of oxygen and water vapor therethrough, said first and second coating layers being bonded together with an adhesive layer having a thickness of 50 nm to 10 µm such that said coating layers are spaced apart by a distance less than the dimensions of the inadvertent discontinuities in said coating layers, said inadvertent discontinuities being selected from:
    a) submicrometer-size pinholes characteristic of coating layer deposition and micro-roughness of said polymer support film;
    b) submicrometer to multimicrometer-size defects due to dust and microparticles; and
    c) cracks and scratches created in production, handling and converting of said substrate;
    said substrate having a transparency greater than 65%, by ASIM D1746-97, said composite layer having an oxygen transmission rate by ASTM F1927 and D3985 lower than 0.1 cm$^3$/(m$^2$day·atm), and a water vapor transmission rate lower than 0.01 g/(m$^2$day) by ASTM F1249.

25. A method according to claim 24 wherein each of said discrete coating layers is a single coating.

26. A method according to claim 24 where at least one of said first and second discrete coating layers is composed of a plurality of discrete single coatings of different materials.

27. A method according to claim 24, wherein said adhesive layer has a thickness of 50 nm to less than 1 µm.

28. A method of producing a transparent support substrate for an organic light emitting device comprising:
  a) coating a first transparent organic polymer film surface with a first coating layer;
  b) coating a second transparent organic polymer film surface with a second coating layer;
  c) bonding said coating layers together, with an adhesive layer, in opposed facing relationship to form a composite layer between said first and second polymer film surfaces, said adhesive layer having a thickness of 50 nm to 10 µm,
    each of said first and second coating layers being impermeable to oxygen and water vapor when formed as a continuous coating; each of said first and second coating layers having inadvertent discontinuities therein such that said composite layer exhibits discontinuity-controlled permeation of oxygen and water vapor therethrough, said bonding with said adhesive layer being such that said first and second coating layers are spaced apart by a distance less than the dimensions of the inadvertent discontinuities in said coating layers, said inadvertent discontinuities being selected from:
    i) submicrometer-size pinholes characteristic of coating layer deposition and micro-roughness of said polymer support film;
    ii) submicrometer to multimicrometer-size defects due to dust and microparticles; and
    iii) cracks and scratches created in production, handling and converting of said substrate;
    said substrate having a transparency greater than 65%, by ASTM D1746-97, said composite layer having an oxygen transmission rate by ASTM F1927 and D3985 lower than 0.1 cm$^3$/(m$^2$day·atm), and a water vapor transmission rate lower than 0.01 g/(m$^2$day) by ASTM F1249.

29. A method according to claim 28 wherein each of said discrete coating layers is a single coating.

30. A method according to claim 29, wherein said transparent support substrate has an oxygen transmission rate by ASTM F1927 and D3985 lower than 0.005 cm$^3$/(m$^2$day·atm).

31. A method according to claim 28 where at least one of said first and second discrete coating layers is composed of a plurality of discrete single coatings of different materials.

32. A method according to claim 28, wherein said transparent substrate has a thickness of 5 µm to 10 mm and said first and second coating layers each have a thickness of 100 nm to 2 µm; and wherein said adhesive layer is impermeable to oxygen and water vapor.

33. A method according to claim 28, wherein said first polymer film surface is defined in a first polymer film, and said first polymer film comprises first and second support films bonded in opposed facing relationship with a release adhesive layer, and step a) comprises coating a surface of said second support film with said first coating layer, and including a final step of:
  d) separating said first support film from said second support film.

34. A method according to claim 28 wherein said first polymer film surface functions as a temporary protective film on the side of the support substrate on which diodes are to be placed and including a step of (d) separating said temporary protective film from said first coating layer.

35. A method according to claim 28, wherein said adhesive layer has a thickness of 50 nm to less than 1 µm.

* * * * *